Aug. 27, 1968 W. E. MUTTER ET AL 3,399,331
ELECTRICAL DEVICE AND CONTACTS
Filed Dec. 24, 1964

INVENTORS
WALTER E. MUTTER
E. DONALD PURCELL
BY [signature]
AGENT 3,399,331

ELECTRICAL DEVICE AND CONTACTS

Walter E. Mutter, Poughkeepsie, and Edward D. Purcell, Wappingers Falls, N.Y., assignors to International Business Machines Corporation, New York, N.Y., a corporation of New York Filed Dec. 24, 1964, Ser. No. 421,035
15 Claims. (Cl. 317—234)

ABSTRACT OF THE DISCLOSURE

A semiconductor device capable of withstanding elevated processing temperatures, the active regions therein having ohmic contacts thereto comprising a composition having relative amounts by weight of carbon and a metal from the platinum group of metals. A preferred composition is 91–93% Pt and 7–9% C. Additional contact materials are disclosed.

This invention relates to an improved semiconductor device and, more particularly, to a novel contact structure for such devices.

Semiconductor devices, since their discovery, have found widespread acceptance as substitutes for earlier electronic components, such as vacuum tubes. Part of this acceptance has been due to the unique ability of semiconductor devices to operate satisfactorily within environmental conditions which would prove destructive to the earlier components. This unique capability of semiconductor devices may partially be attributed to certain properties of the semiconductive materials, and partially to the packaging techniques which may readily be employed with them. For instance, encapsulating semiconductor devices, particularly planar semiconductor devices, with glass compounds has proven to be a satisfactory packaging mode. The glass serves to seal the semiconductor surface, thereby isolating it from ambient impurities.

As with any technique offering advantages, a certain number of disadvantages were found to accompany glass encapsulation. The fabrication techniques required by certain glasses frequently introduced processing parameters which proved harmful to the semiconductor device itself. When the process parameters were varied, or different glasses used, so as to eliminate, or vastly reduce, these harmful device interactions, an inferior glass coating resulted.

To be more specific, when glasses were employed that required high firing temperatures (e.g., over 700° C.), migration of the metals forming ohmic contacts on the devices into the body of the semiconductor device frequently resulted—with attendant destruction of certain device electrical properties. However, the high firing temperature glasses did provide a rugged glass coating. By contrast, glasses requiring a lower firing temperature formed a coating whose coefficient of thermal expansion did not match that of the underlying semiconductor material; this necessitated the formation of a thinner glass coating so as to minimize the possibility of subsequent cracks upon further temperature variations. The lower firing temperatures did solve the problem of contact metal migration into the device body.

Prior then to the conception of this invention, semiconductor device fabricators could, in general terms, choose between a rugged glass coating whose fabrication harmed the properties of the semiconductor device, or a fragile glass coating which served in a less than satisfactory manner while preserving the electrical properties of the device. One solution to this perplexing choice would be the development of a low firing temperature glass whose coefficient of thermal expansion would closely match that of the underlying semiconductor body. However, such a glass composition was not developed. An alternative solution would be to conceive a contact metal offering stability at elevated temperatures so that a high firing temperature glass coating could be used—with assurance that the electrical properties of the device would be maintained. Efforts have been made to provide such contact metals. However, no such satisfactory metal became available prior to applicants' invention.

Accordingly, it is a general object of this invention to eliminate many of the stated shortcomings associated with the prior art.

Another object of this invention is to provide a semiconductor device having a novel contact structure of stable properties.

Still another object of this invention is to provide a semiconductor device having a novel contact structure offering stability even during exposure to elevated processing temperatures.

A further object of this invention is to provide a glassed semiconductor device having a novel contact structure of stable properties.

Yet another object of this invention is to provide a glassed semiconductor device having a novel contact structure offering stability even during exposure to elevated processing temperatures.

Another object of this invention is to provide a novel contact structure.

A further object of this invention is to provide a novel contact structure of stable properties.

A still further object of this invention is to provide a novel contact structure offering stability even during exposure to elevated processing temperatures.

Yet another object of this invention is to provide a novel composition of matter having as one of its characteristics stability at elevated temperatures.

One embodiment of the invention disclosed relates to a semiconductor device having a novel contact structure. The contact structure, formed normally, but not necessarily, in apertures within a protective oxide coating upon the surface of the semiconductor device, comprises a metal from the platinum group of metals, as well as carbon. In one preferred embodiment of this device, the metal from the platinum group is platinum itself. Likewise, in another preferred embodiment, the novel contact structure is sealed with a coating of high conductivity metal, and the latter metal can be run out to an edge of the device so as to enable electrical connections to be made to the device. The high conductivity metal comprises molybdenum preferably, although equivalents may be employed.

Another embodiment of this invention relates to a glassed semiconductor device having a novel contact structure. The novel contact structure is formed within apertures in a semiconductor oxide film formed on one surface of the semiconductor device, and the novel contact structure comprises a metal from the platinum group of metals, as well as carbon. The semiconductor device having such contacts is encapsulated with a protective coating of high firing temperature (greater than 700° C.) glass. In a preferred form of this embodiment, the novel contact structure would, prior to the glassing operation, have a land pattern of high conductivity metal formed upon its upper surface and bridging the peripheral semiconductor oxide. The latter metal patterns are extended to outer edges of the device so as to enable electrical connections to be made to the device. A layer of high firing point glass is then placed over the upper surface of the semiconductor device and apertures are etched through the glass at selected locations over the extended land patterns in order to accommodate external electrical connections.

Still another embodiment of this invention, divorced from a semiconductor device, comprises a novel ohmic contact structure. That structure comprises a metal from the platinum group of metals, as well as carbon and, in a preferred embodiment, would comprise platinum itself and carbon.

Another embodiment of this invention relates to the novel ohmic contact structure with a coating of high conductivity metal upon it. The high conductivity metal is preferably molybdenum, although equivalents such as chromium or tungsten may be employed.

A further embodiment of this invention resides in the novel composition of matter comprising a metal from the platinum group of metals in greater quantities by weight and carbon in lesser quantities by weight. In a preferred form of this embodiment, the metal from the platinum group comprises platinum itself and has a quantity by weight in the region of 91 to 93% and the quantity of carbon by weight is in the region of 7 to 9%.

The disclosed invention, in its various embodiments, offers a number of distinct advantages—primarily deriving from the fact that the platinum group metal-carbon composition of matter is uniquely stable at elevated temperatures. When used to form electrical contacts to an electrical device, subsequent processing of the device may be effected at high temperatures without fear of deteriorating the electrical contact. The contact structure, when applied to a semiconductive device, offers an ohmic contact that is not only tolerant of high temperature processing, but also lends itself to a coating of a high conductivity metal so as to enhance the electrical characteristics of the ohmic contact.

A particularly strong advantage of the instant invention arises in its application to current semiconductor device technology, where a device is encapsulated with a protective glass coating. The ohmic contact structure set forth in this invention enables a high firing temperature (above 700° C.) glass to be employed for encapsulating the semiconductive device. This can be accomplished without having particles of the contact structure penetrate the semiconductor device and so destroy the electrical properties of the semiconductor device. The high firing temperature glass provides a significantly better encapsulation than low firing point glasses used in the prior art; this is due to a closer matching, almost an identity, of the coefficient of thermal expansion of the glass to that of the semiconductor device itself. When the coefficient of thermal expansion is matched so closely, one need not worry about cracks appearing in the glass structure due to subsequent processing operations. A significantly thicker coating of glass may be applied when the high firing temperature glass is used—and this makes thickness monitoring a simpler operation. In summary, the glassed semiconductor devices disclosed herein offer an ohmic contact having very satisfactory electrical properties; a semiconductor device whose electrical properties may be tailored initially and maintained despite subsequent processing; and an encapsulating coating offering ease of fabrication as well as notable freedom from cracking.

That embodiment of the invention relating to a glassed semiconductor device wherein the ohmic contact described herein is coated with a high conductivity metal also offers several unique advantages. The high conductivity metal enables the semiconductor to be attached to a circuitry-bearing substrate by using a solder ball technique, which is more fully described in a copending application assigned to the same assignee as the instant application and bearing U.S. Ser. No. 291,322 (series of 1960). Attachment is firm and electrical conductivity is sure. The attachment is frequently made at an edge of the device, or at least at a location not immediately aligned with the contact, so that the glass coating can protect the device and its contacts from harmful environmental factors.

It is noteworthy that the advantages present in the improved devices are obtainable not at the cost of extremely complicated and expensive fabrication procedures, but rather by utilizing a number of conventional, well-refined fabrication procedures. For instance, the contact structure comprising a metal from the platinum group of metals and carbon may be deposited upon a semiconductive device by merely introducing such metal into a carbon crucible. Electron bombardment of the metal within the carbon crucible then results in a deposition of the desired contact structure—and the carbon is introduced into the metal from the crucible itself. In an alternative manner, sputtering of a cathode comprising a metal from the platinum group of metals and carbon may be used. The carbon will thus be mixed with the metal, and deposited as an unified contact structure on a semiconductor device. The glassing operation too may be conducted with less control present when high firing point glasses are used. A thicker film of high firing point glasses can be tolerated, since their coefficient of thermal expansion more closely matches that of the semiconductor body. Consequently, the monitoring of the glass thickness is made easier. And, as noted before, subsequent elevated processing temperatures are less fearsome, since the contacts so formed are uniquely resistant to deterioration and migration under elevated processing temperatures.

The disclosed invention, in all its embodiments, offers a number of distinct advantages not present in the prior art. A principal advantage is an ability to withstand elevated processing temperatures, while concomitant advantages are ease, simplicity and economy of fabrication procedures.

The foregoing and other objects, features and advantages of the invention will be apparent from the following more particular description of preferred embodiments of the invention, as illustrated in the accompanying drawings.

In order to provide a background for a full description of this invention, FIGS. 1 and 2 will be described briefly. Then, after an overall view of the invention has been obtained, the various embodiments will be presented in detail.

Figure 1:
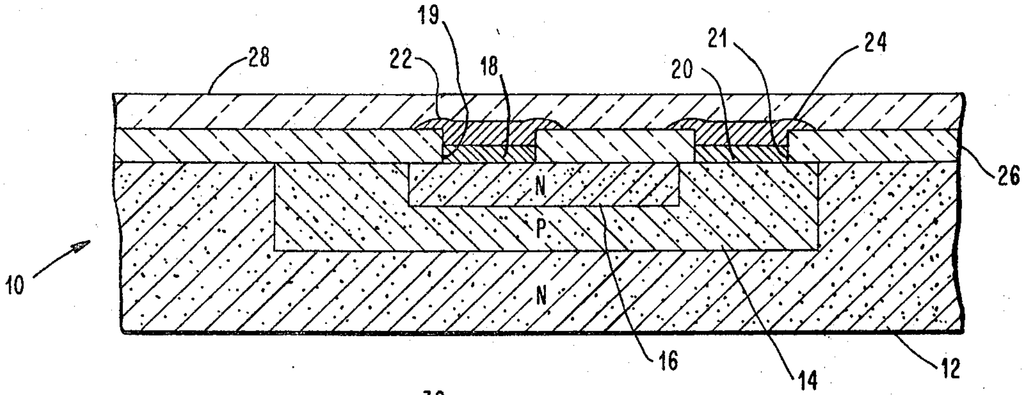
FIG. 1 shows compositely the novel contact structure of this invention; that contact structure applied to a semiconductor device; that contact structure bearing a high conductivity metal coating; and a glassed semiconductor device incorporating that contact.

FIG. 1 shows compositely the various embodiments of this invention. It is a sectional view of a planar or slab-type semiconductor device, and may be considered as having been taken along line 1—1 of FIG. 2—a plan view of such a device. Semiconductor device 10 comprises a plurality of opposed conductivity regions 12, 14, 16. The semiconductor device 10, by way of example, comprises a slab of N type silicon forming region 12, although other semiconductive materials could be employed. Region 14 has a sufficient amount and type of impurity, such as aluminum, to characterize it as a P type region, while region 16 is heavily doped with any well-known N type impurity, such as arsenic.

It should be understood that the semiconductor device 10 contemplated herein may comprise only one such grouping of opposed conductivity type regions 12, 14, 16 or a plurality of such groupings; the number of such groupings is determined by the ultimate function to be performed by the device. For purposes of illustration, only one such grouping will be discussed here.

In order to operate semiconductor device 10, it is necessary to establish electrical connection to individual regions 12, 14, 16. Ohmic contact 18 in aperture 19 connects region 16 to external items, while ohmic contact 20 in aperture 21 similarly connects region 14. In order to provide voltages and currents from other devices to semiconductor device 10, conductive land patterns 22, 24 are formed on ohmic contacts 18, 20 respectively. Likewise, in order to protect the noncontacted areas of semiconductor device 10, semiconductor oxide layer 26 is grown thereon as described subsequently, thereby sealing the upper surface of semiconductor device 10. In order to protect the entire device 10 from the harmful effects of environmental conditions, a glass layer 28 is fired onto oxide layer 26 and those noncontacted areas of land patterns 22, 24 (shown in phantom in FIG. 2), will also be described subsequently.

Figure 2:
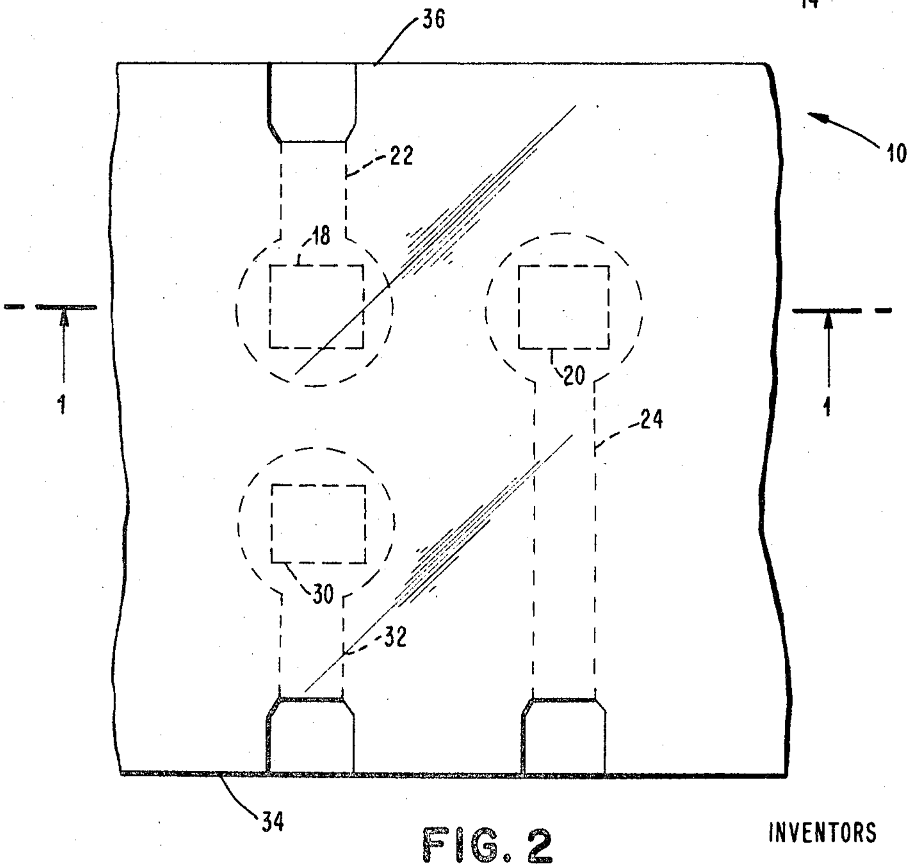
FIG. 2 is a plan view of a typical semiconductor device employing this invention.

FIG. 2 shows a plan view of the structure of FIG. 1. Like elements are numbered similarly in both figures. For example, semiconductor device 10 is shown having ohmic contacts 18, 20 in phantom, along with an additional ohmic contact 30. Conductive land patterns 22, 24 are shown disposed above ohmic contacts 18, 20 respectively, while conductive land pattern 32 is disposed over ohmic contact 30. Those portions of land patterns 22, 24, 32 shown in phantom are beneath glass layer 28 and protected by it. Those portions of land patterns 22, 24, 32 shown in solid lines are exposed so as to enable external electrical connections to be made to device 10.

The description of FIGS. 1 and 2 thus far has been simplified so as to introduce the primary elements of the various embodiments contemplated for this invention. The following more detailed discussion will cover those embodiments in a more illustrative manner. Since like elements are shown and numbered in FIGS. 1 and 2, it may be convenient to refer to both figures essentially simultaneously so as to gain a fuller impression of the embodiment being discussed.

In that embodiment relating to the novel ohmic contact structure itself as applied to a semiconductor device, either contact 18, 20, or 30 may serve to illustrate in a general manner the contact structure. The novel aspect of such a contact (e.g., 18) resides in its composition. Contact 18 is to be formed from a plurality of elements comprising at least a metal from the platinum group of metals and carbon. As noted earlier, the platinum group of metals includes ruthenium, rhodium, palladium, osmium, iridium, as well as platinum. In order to achieve stability in the face of exposure to subsequent elevated processing temperatures (for example, above 700° C.)—and this is a prime object of this invention—it has been found desirable to have the metal from the platinum group of metals present in a weight percentile of roughly 91 to 93% and to have the carbon present in a weight percentile of roughly 7 to 9%. Should exposure to lower processing temperatures be contemplated (e.g., a maximum in the vicinity of 500° C.) smaller amounts of carbon may be introduced by weight into the structure of contact 18. In the latter situation, an amount of carbon roughly 3.5% by weight and a correspondingly increased amount of the metal from the platinum group of metals has been found to yield a satisfactory ohmic contact. However, the preferred embodiment resides in having platinum itself present in a weight percentile of 91–93% and carbon present in a weight percentile 7–9% so as to insure stability of the ohmic contact when exposed to processing temperatures in excess of 700° C. This stability can in part be attributed to the fact that there is substantially no migration of the ohmic contact material into the body of semiconductor device 10 under these elevated processing temperatures; however, other theoretical factors not fully determined and evaluated may be present and contributing to the stability of the ohmic contact.

The processing steps used to fabricate an ohmic contact having the stipulated constituents, once the desirability of such constituents is realized, although important, are not critical. Several processes, along with conventional apparatus, may be utilized to fabricate the contact structure. For example, the metal from the platinum group of metals could be placed in a carbon crucible. Placed above the carbon crucible would be semiconductor device 10. Those areas to receive an ohmic contact are exposed and facing the crucible. Those areas not to receive an ohmic contact are coated by a suitable protective material, for example, oxide film 26. The metal from the platinum group of metals present in the carbon crucible is then bombarded by an electron beam, thereby vaporizing the metal along with small amounts of the carbon crucible. It is in this manner that the carbon is introduced to the ohmic contact structure. These particles of carbon and metal from the platinum group of metals then impinge semiconductive device 10, and form the ohmic contact upon those exposed portions of semiconductor device 10. Thus, ohmic contacts 18, 20, 30 are formed.

As an alternative technique, cathode sputtering may be used. There, a cathode of metal from the platinum group of metals and carbon is bombarded, and the particles are then deposited upon exposed portions of semiconductor device 10. In both the electron bombardment technique utilizing a carbon crucible and the cathode sputtering technique, good results were obtained by preheating the semiconductor device 10 to the region of 200–300° C. and maintaining semiconductor device 10 at that temperature during the contact fabrication process. The cathode sputtering technique was found to work well when employed with platinum metal itself and carbon.

In another embodiment of this invention, a coating of high conductivity metal upon the ohmic contact structure, which is formed on a semiconductor device, results in an improved electrical contact. This improved contact flows at least partially from the enhanced electrical conductivity made available to the ohmic contact itself, as well as from other factors not fully evaluated. These results are accomplished in this example by depositing the high conductivity metal on top of an ohmic contact structure (e.g., 18) and over peripheral regions of oxide film 26 surrounding the contact structure, thereby bridging the oxide film 26 and contact structure 18. Oxide film 26 may, by way of example, be grown on unmasked surfaces of device 10 by placing device 10 in an oxidizing atmosphere at an elevated temperature and adding water vapor to expedite growth. As may be seen from FIG. 2, the high conductivity metal coating 22, 24, or 30 in addition to serving the above function, also provides a ready means for establishing electrical conductivity from an edge 34 or 36 of the semiconductor device 10 to the various ohmic contacts 18, 20, 30. In a preferred form of this embodiment, it is contemplated that the high conductivity metal will comprise molybdenum; suitable substitutes, such as chromium or tungsten, may also be used. It is only necessary that the metal have a high conductivity. The high conductivity metal may be deposited by conventional apparatus, such as vapor deposition techniques. It is contemplated that a high conductivity metal film of, by way of example, roughly 10,000 angstroms would be deposited upon an ohmic contact having a thickness of, by way of similar example, roughly 500 to 1,000 angstroms.

Still another embodiment of this invention relates to an improved semiconductor device bearing the ohmic contact or the modified ohmic contact of this invention wherein the semiconductor device has its outer surface coated with high firing point glass so as to protect the entire device from subsequent exposure to destructive atmospheric elements. In such an embodiment, either a bare ohmic contact of the type shown as 18 in FIG. 1, or an ohmic contact of the type shown as 18 coated with a high conductivity metal 22 may be utilized. A coating of high firing point glass, such as glass coating 28 in FIG. 1, would then be applied to the entire surface of the semiconductor device. The high firing point glass may be of any of a number of glasses whose firing temperature is greater than 700° C.; for example, Corning Experimental Code Number X760–LZ glass, which fires at 760° C., may be employed. The method of applying the glass comprises placing a slurry of glass particles onto those areas of semiconductor device 10 which are to be covered (the entire area can be coated, followed by etching away of unwanted glass at edge locations) and then firing the entire unit in a high temperature furnace so as to set the glass particles. Upon cooling, a stable, relatively thick film of glass having a thermal coefficient of expansion essentially matching that of semiconductor device 10 results. This coating 28 encapsulates and protects the semiconductor device. Electrical connections can be made to the exposed areas of land patterns 22, 24, 32 by the solder ball technique described in the previously referenced U.S. application, Ser. No. 291,322 (series of 1960).

As noted earlier, still another embodiment of this invention resides in the contact structure itself. Such a contact structure would comprise by weight greater amounts of metal from the platinum group of metals and carbon in lesser amounts. In a preferred embodiment, the metal from the platinum group of metals would be present in a weight percentile of 91 to 93% and the carbon would be present in a weight percentile of 7 to 9%. Likewise, in the preferred embodiment the metal from the platinum group of metals would comprise platinum itself. Such an ohmic contact may find application wherever it is desired to provide a low resistance electrical contact to an electrical device, and where the electrical contact must further be resistant to the deleterious effects of elevated temperature processing. The contact structure may be formed by any of the techniques set forth above; i.e., electron bombardment of a metal from the platinum group of metals in a carbon crucible, cathode sputtering of a cathode comprising a metal from the platinum group of metals and carbon, or other vapor deposition techniques. Likewise, the ohmic contact so formed may have a coating of high conductivity metal deposited upon it to improve its electrical properties; molybdenum is used in a preferred embodiment, although chromium or tungsten would likewise prove acceptable.

Still another embodiment of this invention resides in the novel composition of matter utilized to form the electrical contacts described. One property of that composition of matter is its ability to withstand elevated processing temperatures. The novel composition of matter comprises an alloy of a metal from the platinum group of metals and carbon. In a preferred embodiment, the metal from the platinum group of metals is present in a weight percentile of 91 to 93% and the carbon is present in a weight percentile of 7 to 9%. Likewise, in that preferred embodiment the metal from the platinum group of metals is present in an atomic percentile of roughly 45% and the carbon metal is present in an atomic percentile of roughly 55%. Also, in the preferred embodiment the metal from the platinum group of metals is platinum itself. This novel composition of matter is not necessarily limited to a composition of matter fabricated by a particular process. Rather, it may be fabricated by any of a number of different processes, such as cathode sputtering or electron bombardment as mentioned above. It is only essential that the alloy have the composition noted both from an elemental and percentile viewpoint.

While the invention has been particularly shown and described with reference to preferred embodiments thereof, it will be understood by those skilled in the art that the foregoing and other changes in form and details may be made therein without departing from the spirit and scope of the invention.

We claim:

1. An improved semiconductor device capable of withstanding elevated processing temperatures, said semiconductor device having a plurality of opposed-type conductivity regions, and ohmic contacts formed to individual ones of said conductivity regions, said ohmic contacts comprising a composition having relative amounts by weight of carbon and a metal from the platinum group of metals.

2. An improved semiconductor device of the type set forth in claim 1 wherein said ohmic contacts comprise a composition having greater amounts by weight of a metal from the platinum group of metals and lesser amounts by weight of carbon.

3. An improved semiconductor device of the type set forth in claim 2 wherein said ohmic contacts comprise a composition having a metal from the platinum group of metals present in a weight percentile of roughly 91 to 93% and carbon present in a weight percentile of roughly 7 to 9%.

4. An improved semiconductor device of the type set forth in claim 2 wherein said ohmic contacts comprise a composition having a metal from the platinum group of metals present in a weight percentile of roughly 95–97% and carbon present in a weight percentile of roughly 3–5%.

5. An improved semiconductor device having a plurality of opposed-type conductivity regions and electrical contacts established to said opposed-type conductivity regions, said electrical contacts comprising an ohmic contact and a coating of high conductivity metal for enhancing the electrical conductivity of said ohmic contact, said ohmic contacts further comprising a composition having carbon and a metal from the platinum group of metals, and said high conductivity metal comprising a metal from the group consisting of molybdenum, tungsten and chromium.

6. An improved semiconductor device of the type set forth in claim 5 wherein said metal from the platinum group of metals is present in a greater amount by weight than said carbon.

7. An improved semiconductor device of the type set forth in claim 6 wherein said metal from the platinum group of metals is present in a weight percentile of 91 to 93% and said carbon is present in a weight percentile of 7 to 9%.

8. An improved semiconductor device of the type set forth in claim 6 wherein said metal of the platinum group of metals is present in the weight percentile of 95–97% and said carbon is present in the weight percentile of 3–5%.

9. An improved semiconductor device for tolerating elevated processing temperatures without deterioration of the electrical properties of said semiconductor device; said semiconductor device comprising a body having a plurality of opposed-type conductivity regions; a semiconductive oxide layer disposed on said semiconductor body, said oxide layer having a plurality of apertures therein; ohmic contacts disposed in individual ones of said apertures, said ohmic contacts comprising a composition having carbon and a metal from the platinum group of metals; and a protective glass layer of high firing point glass disposed over said oxide layer and said ohmic contacts.

10. An improved semiconductor device for tolerating elevated processing temperatures without deterioration of the electrical properties of said device, said device being of the type set forth in claim 9 wherein said metal from the platinum group of metals is present in a greater amount by weight than said carbon.

11. An improved semiconductor device of the type set forth in claim 10 wherein said metal from the platinum group of metals is present in a weight percentile of roughly 91 to 93%, and said carbon is present in a weight percentile of roughly 7 to 9%.

12. An improved semiconductor device of the type set forth in claim 10 wherein said metal from the platinum group of metals is present in the weight percentile of roughly 95–97%, and said carbon is present in the weight percentile of roughly 3–5%.

13. An improved semiconductor device for tolerating elevated processing temperatures without deterioration of the electrical properties of said semiconductor device; said semiconductor device comprising a body having a plurality of opposed-type conductivity regions; a semiconductive oxide layer disposed on said semiconductor body, said oxide layer having a plurality of apertures therein; electrical contacts disposed within individual ones of said apertures in said oxide layer, individual ones of said electrical contacts comprising an ohmic contact of a composition having a greater amount by weight of a metal from a platinum group of metals and a lesser amount by weight of carbon; a protective layer of high firing point glass disposed over said oxide layer and said contacts; and said ohmic contacts having a coating of a high conductivity metal from the group consisting of molybdenum, tungsten and chromium, deposited thereon and extending between said glass layer and said oxide layer at least in a region peripheral to said ohmic contact.

14. An improved semiconductor device of the type set forth in claim 13 wherein said ohmic contact comprises a composition having relative amounts by weight of carbon and a metal from the platinum group of metals, and said metal from the platinum group of metals is present in a greater amount by weight than said carbon.

15. An improved semiconductor device of the type set forth in claim 14 wherein said metal from the platinum group of metals is present in an amount by weight roughly 91 to 93% and said carbon is present in an amount by weight of roughly 7 to 9%.

References Cited

UNITED STATES PATENTS

| | | | |
|---|---|---|---|
| 1,216,420 | 2/1917 | Dodgson | 200—166 |
| 2,253,401 | 8/1941 | Slepian | 200—166 |
| 2,499,420 | 3/1950 | Sakatos | 200—166 X |

JOHN W. HUCKERT, *Primary Examiner.*

R. F. POLISSACK, *Assistant Examiner.*